United States Patent [19]

Hammond et al.

[11] Patent Number: 5,329,245
[45] Date of Patent: Jul. 12, 1994

[54] HYBRID HIGH POWER AMPLIFIER

[75] Inventors: Russell E. Hammond, La Jolla; Leopold J. Johnson, Valley Center, both of Calif.

[73] Assignee: The United States of America as represented by the Secretary of the Navy, Washington, D.C.

[21] Appl. No.: 86,079

[22] Filed: Jun. 28, 1993

[51] Int. Cl.$^5$ .............................................. H03F 3/217
[52] U.S. Cl. ...................................... 330/251; 330/146
[58] Field of Search ..................... 330/10, 207 A, 251, 330/146

[56] References Cited

U.S. PATENT DOCUMENTS

| | | |
|---|---|---|
| 3,325,742 | 8/1963 | Moriyasu . |
| 3,908,170 | 9/1975 | Buhler . |
| 3,995,226 | 11/1976 | Berning . |
| 4,152,661 | 5/1979 | Zeis . |
| 4,163,198 | 7/1979 | Berning . |
| 4,324,950 | 4/1982 | Strickland . |
| 4,523,152 | 6/1985 | Garde . |
| 5,148,116 | 9/1992 | Robinson . |

FOREIGN PATENT DOCUMENTS 1363436 12/1987 U.S.S.R. ................................ 330/10
809492 3/1991 U.S.S.R. ................................ 330/10
2134735 8/1984 United Kingdom ................ 330/10

Primary Examiner—Steven Mottola
Assistant Examiner—Tiep Nguyen
Attorney, Agent, or Firm—Harvey Fendelman; Thomas Glenn Keough; Peter A. Lipovsky

[57] ABSTRACT

The invention provides a high power, low distortion, high efficiency amplifier design incorporating a high efficiency switching amplifier used in conjunction with a linear difference amplifier. The high efficiency switching amplifier, typically of full or half bridge design, is designed to generate a high efficiency, arbitrarily formed, wave portion such as a square wave. The high efficiency waveform is scaled down and is compared to a desired reference, such as a sinusoid. The output of the comparison is the analog difference (mathematical subtraction) between the reference waveform and the scaled-down switch amplifier output wave. This "difference" signal is then used to drive the linear difference amplifier which simply scales the signal linearly. The two power signals, one from the switching amplifier and the other from the linear difference amplifier, are then summed magnetically. To permit a low harmonic output, the input signals to the switching amplifier and the reference are locked together in frequency.

24 Claims, 4 Drawing Sheets (1st AMPLIFIER)     (2nd AMPLIFIER)     (PURE SINUSOID)

HYBRID HIGH POWER AMPLIFIER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

1. Field of the Invention

This invention relates generally to amplifiers, and in particular, but without limitation thereto, to high power, low distortion, high efficiency amplifiers for use in powerful (multiple megawatt) radio transmitters.

2. Description of the Related Art

The construction of power amplifiers for transmitters has followed two basic approaches. The first of these has been an all-tube design using tubes in a class A, class B, or class C type amplifier circuit topology. A primary disadvantage of this approach is that the mechanism for amplification is through dissipation. Thus the theoretical maximum for efficiency is 50 percent or 70-some percent depending upon circuit design. In extremely large transmitters (the United States Navy has 2,000,000 watt (2 MW) transmitters) energy consumption is of significant expense and concern.

The other basic approach to power amplifier construction is an all solid state switching design such as a class D full bridge circuit. The advantage of this design is high efficiency. The disadvantage is the difficulty in constructing an output signal having low harmonic distortion when the desired output frequency is high. This is due to the limitation in switching frequency of currently available power switches (FET's, Bipolar's, etc.). Low harmonic distortion is critical because of interference in other frequency bands.

In U.S. Pat. No. 4,523,152 there is described an invention titled: "High-Efficiency Feedforward-error-correction Amplifier". This patent describes an amplifier that uses a combination of linear and switching amplifiers in pursuit of a high efficiency and low distortion output. The waveforms combined are identical, usually nominally sinusoids. In this invention an input signal is fed to the linear amplifier with its output being fed to the switching amplifier. The switching amplifier produces a scaled or amplified replica of the linear amplifier's output. The output of the switching amplifier is fed back to the input of the linear amplifier to produce an output of this system.

This patented scheme employs switching elements within its switching amplifier whose physical limitations prohibit high power (tens of kilowatts), high frequency (>50 kilo Hertz (kHz) max) operation. When pulse wave modulation is used as described in this patent, the amplifier's output frequency will become much more limited. In addition, because of the feedforward, feed-back nature of this invention, inevitable phase delays will result. Further, an optional low pass filter is proposed, but appears as an essential element to eliminate switching harmonics. This latter requirement will impede high power implementations.

There is thus a need for a high power, low distortion, high efficiency amplifier capable of a broad range of output frequencies, that is simple in operation, and that does not experience undesired phase delays.

SUMMARY OF THE INVENTION

The invention provides a high power, low distortion, high efficiency amplifier design incorporating a high efficiency switching amplifier used in conjunction with a linear difference amplifier. The high efficiency switching amplifier, typically of full or half bridge design, is designed to generate a high efficiency, arbitrarily formed, wave portion such as a square wave. The high efficiency waveform is scaled down and is compared to a desired reference, such as a sinusoid. The output of the comparison is the analog difference (mathematical subtraction) between the reference waveform and the scaled-down switch amplifier output wave. This "difference" signal is then used to drive the linear difference amplifier which simply scales the signal linearly. The two power signals, one from the switching amplifier and the other from the linear difference amplifier, are then summed magnetically to produce an amplified desired output signal. To permit a low harmonic output, the input signals to the switching amplifier and the reference are locked together in frequency.

OBJECTS OF THE INVENTION

It is an object of this invention to provide an improved high power amplifier.

Another object of this invention is to provide an improved high power amplifier capable of a broad range of output frequencies.

Yet another object of this invention is to provide an improved high power amplifier that permits a broad range of output frequencies while maintaining high efficiency and low distortion.

Still another object of this invention is to provide an improved high powered amplifier that makes use of existing components.

Other objects, advantages and new features of the invention will become apparent from the following detailed description of the invention when considered in conjunction with the accompanied drawings.

DESCRIPTION OF THE PREFERRED EMBODIMENT

Figure 1:
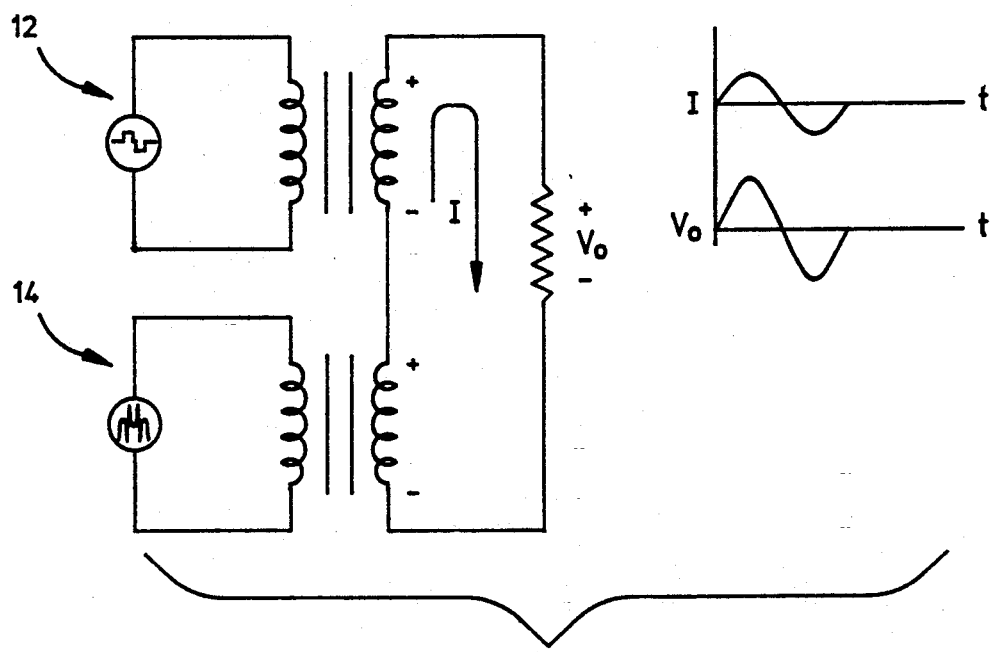
FIG. 1 illustrates a simplified schematic of the invention accompanied by representative current and voltage output waveforms.

Referring now to FIG. 1 a simplified representative schematic of the invention is disclosed. In this schematic is a first amplifier 12 such as a high efficiency switching amplifier of class D construction. The first amplifier is used in conjunction with a second amplifier 14 such as a linear difference amplifier. In order to enhance the efficiency of the invention, the contribution of the linear amplifier is minimized. As can be seen, the outputs of the two amplifiers are summed to produce desired current and voltage outputs as depicted in the figure.

Figure 2:
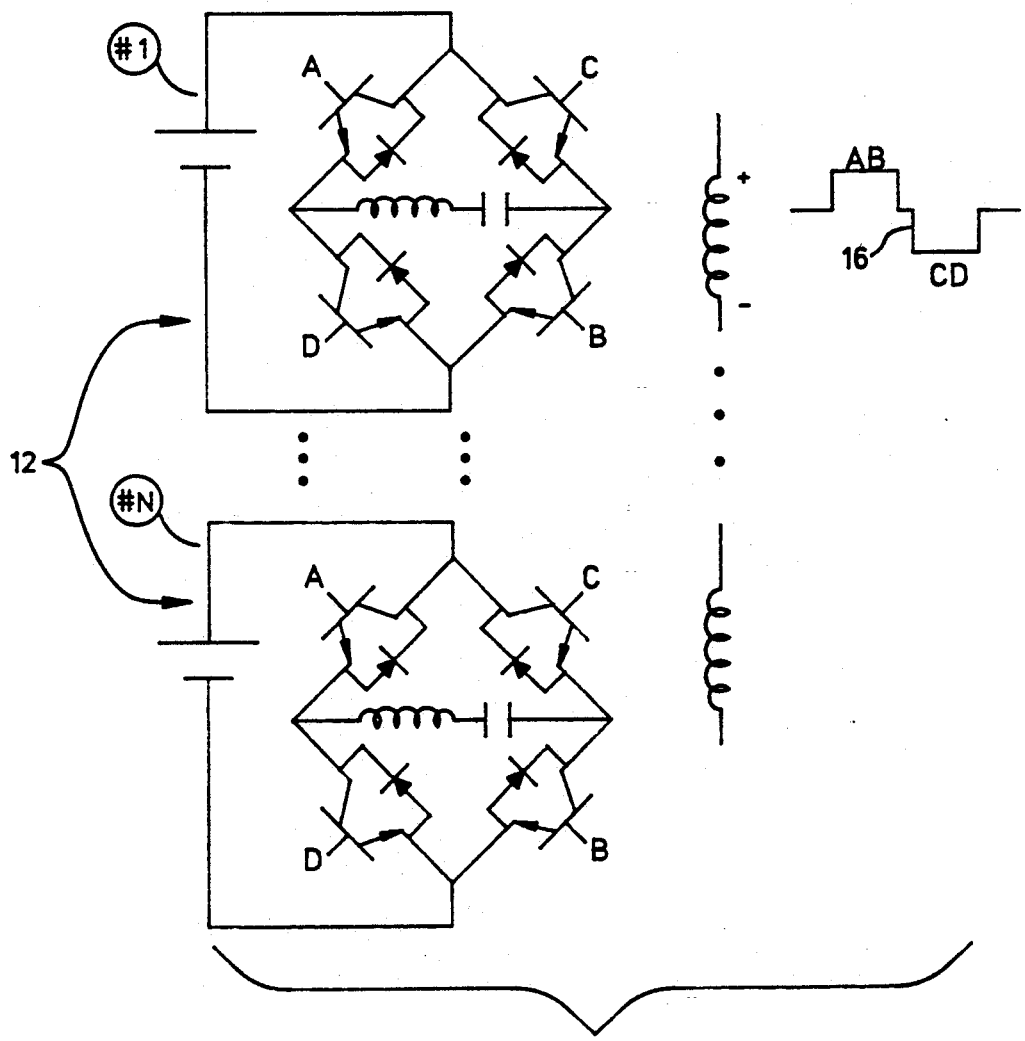
FIG. 2 is a representative embodiment of a switching amplifier scheme as may be used with the invention.

Referring now to FIG. 2 a representative first amplifier 12 is shown of a conventional class D switching amplifier construction. Such construction is simple and may be used to produce a highly efficient square wave of voltage at a desired frequency. As can be seen in the figure, the amplifier may be constructed from a single bridge (#1) up to a plurality (#N) of bridges (with the transformer secondaries being connected in series), with additional bridges being utilized as power requires. Transistor switch bases A, B, C and D of each bridge are operably coupled to a control (not shown) to produce a desired output waveform such as that depicted as 16. The bridge operates by turning switches A and B on together, with C and D off, to form the positive pulse of pulse train 16. The negative pulses likewise are formed by turning on switches C and D with switches A and B being off. The bridge switches may be of almost any type of solid state switch including bipolar transistors, FETs, GTOs, IGBTs, etc. Expected efficiencies with this type of amplifier can approach 95 percent.

Figure 3:
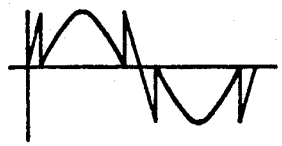
FIG. 3 illustrates a representative linear amplifier output waveform.

Second amplifier 14 shown in FIG. 1 may be constructed of a large tube type linear amplifier operated either in a class A or class B mode to be described. In the representative embodiment of the invention shown, the function of this second amplifier is to produce a waveform such as that depicted in FIG. 3.

Figure 4:
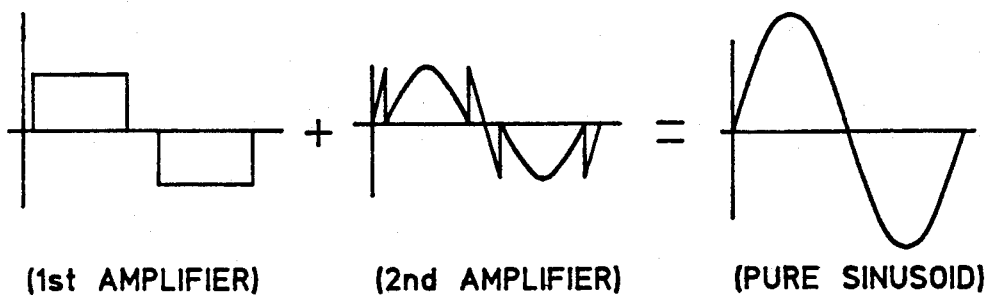
FIG. 4 is a representative example of waveforms summed to produce a desired output.

As can be seen in FIG. 4, this waveform is summed with the output of the first amplifier to produce a desired output waveform such as a pure sinusoid.

Figure 5:
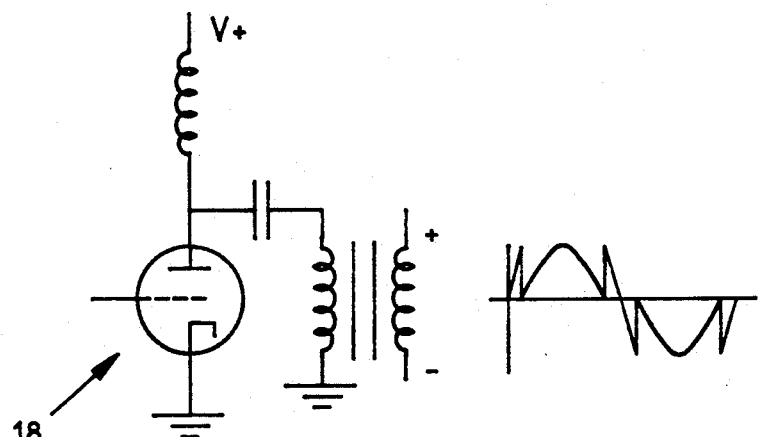
FIG. 5 illustrates a representative linear amplifier circuit and accompanying output waveform.

The linear, second amplifier utilized in the invention may be the class A amplifier circuit depicted in FIG. 5. In this circuit tube 18 is a linear dissipative element such as a large triode tube.

Figure 6:
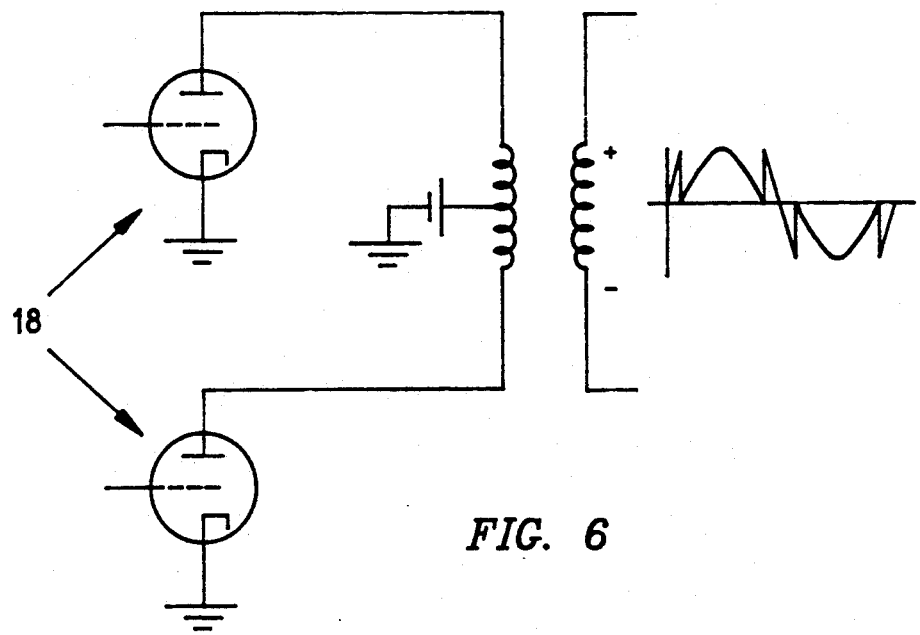
FIG. 6 illustrates a second representative linear amplifier circuit with accompanying waveform.

The second amplifier may also be a class B power amplifier such as that depicted in FIG. 6 also having tubes 18.

A difference between the class A and class B amplifiers is that class A has a maximum theoretical efficiency of 50 percent and class B is 78.5 percent efficient. In practice though, 16 real efficiencies are less.

Figure 7:
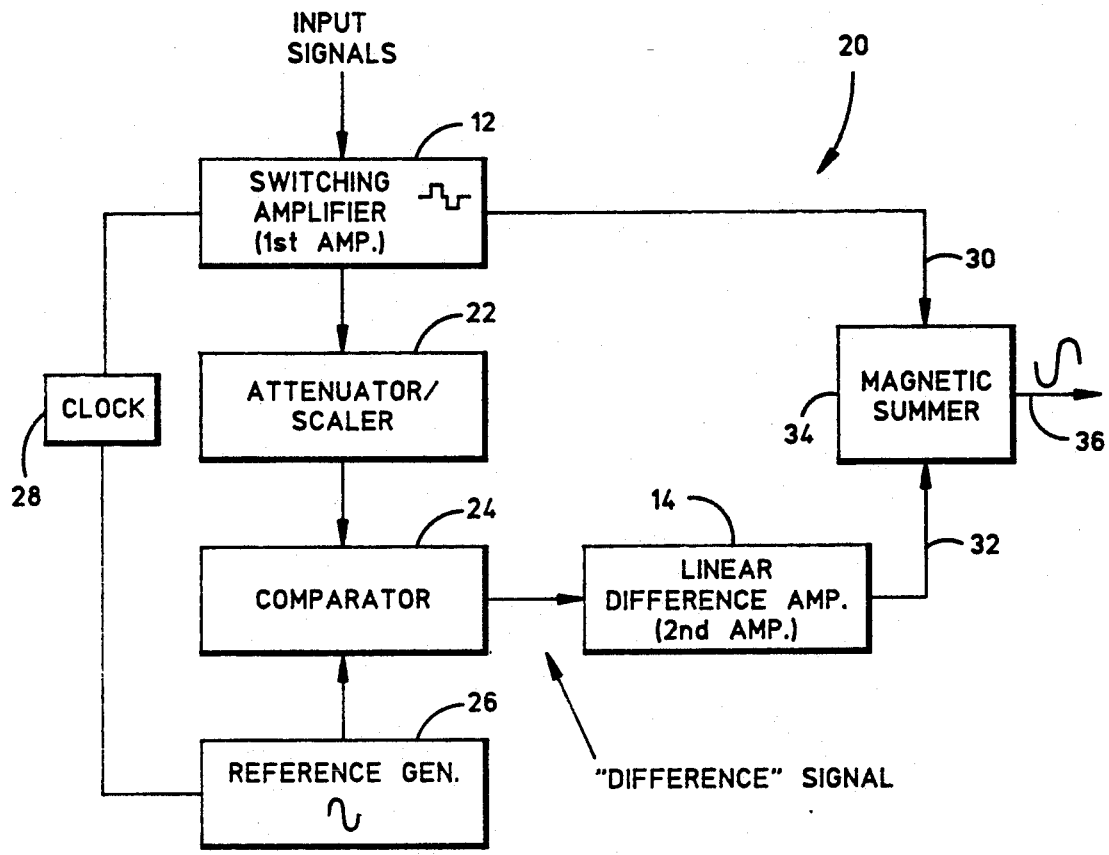
FIG. 7 illustrates a system block diagram having components such as may be used with an implementation of the invention.

Referring now to FIG. 7, a representative system block diagram utilizing the scheme of the invention is shown. As can be seen, first amplifier 12 is utilized to construct a high efficiency arbitrarily formed wave portion such as a square wave. The output of amplifier 12 is fed to an attenuator/scaler 22 which can be in its simplest implementation just a resistive voltage divider. Attenuator/scaler 22 attenuates the output of first amplifier 12 and provides a replication of the amplifier's output.

The output of attenuator/scaler 22 is then fed to a comparator along with a desired reference waveform, such as a sinusoid, provided by reference generator 26. Input signals to amplifier 12 and reference generator 26 are locked together in frequency by clock 28 to allow a low harmonic power output signal to be developed.

The output from comparator 24 is not the usual binary logic output of some comparators. Instead, it is the analog difference (mathematical subtraction) between the reference waveform, in this case a sinusoid, and the scaled down high efficiency waveform, in this case a square wave. The difference waveform output from comparator 24, depicted as a "difference" signal, is used to drive second amplifier 14, a linear difference amplifier. Amplifier 14 amplifies the difference of the signals linearly.

Amplifier outputs 30 and 32 are then serially voltage summed magnetically in summer 34 to produce an amplified desired output signal 36. Such a magnetic summer could be two transformers with their secondaries in series so that their outputs are summed.

As can be seen, system 20 works by extracting a difference signal from reference and high efficiency waveforms, providing, unity voltage gain, power amplification to this difference signal, and then adding the amplified difference to the high efficiency waveform to reform the reference waveform without a feedback loop.

It should be noted that the operation of the hybrid amplifier of the invention will be limited by the constraints of the physical circuit element employed. In particular, large amplifier tubes can only support current in one direction. This limits the waveform contribution of the second (linear amplifier) and the first (switching amplifier). In particular, the waveforms depicted in FIG. 8 and shown in an alternative form in FIG. 9, have been found to provide efficient results.

Figure 8:
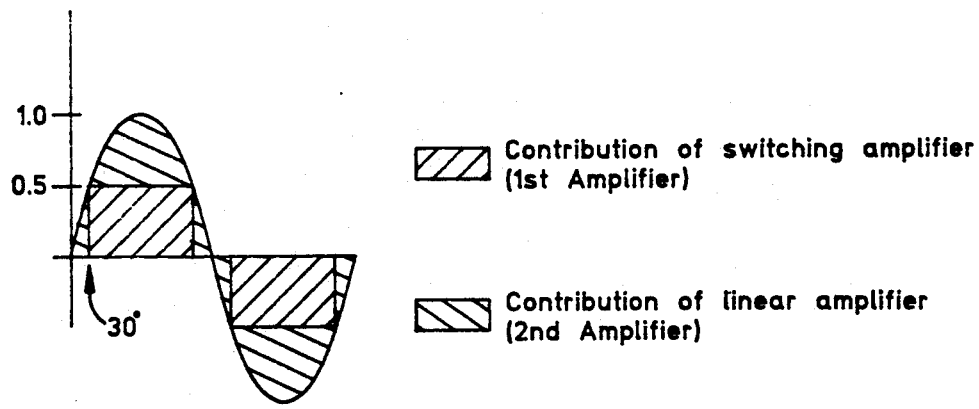
FIGS. 8-10 illustrate output waveforms used to describe the operation of the invention.
Figure 9:
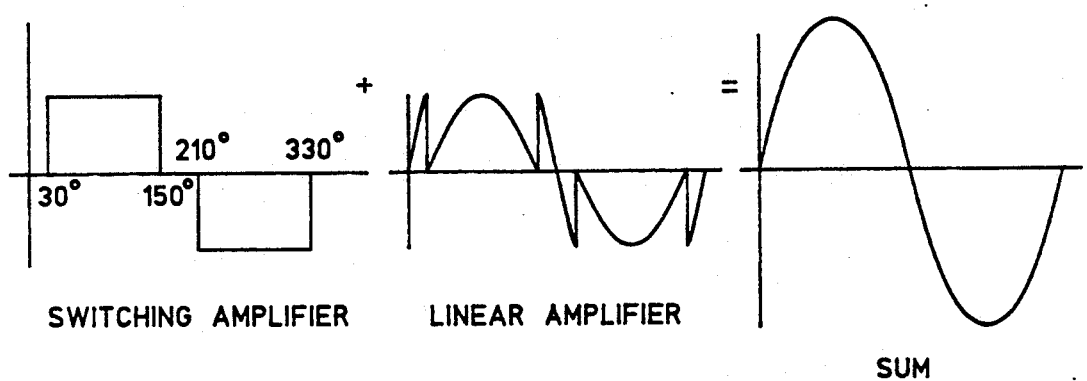
Figure 10:
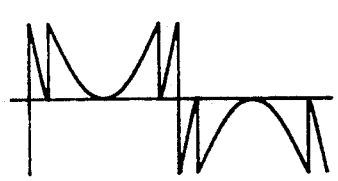

The waveforms shown in FIG. 8 and alternatively in FIG. 9 insure unidirectional current through utilized amplifier tubes and minimize the size of the second, linear amplifier voltage source to maximize efficiency. It should be noted that the second, linear amplifier dissipates power inverse to its waveform shown in FIG. 9. Thus the linear amplifier blocking waveform looks like that depicted in FIG. 10.

Figure 11:
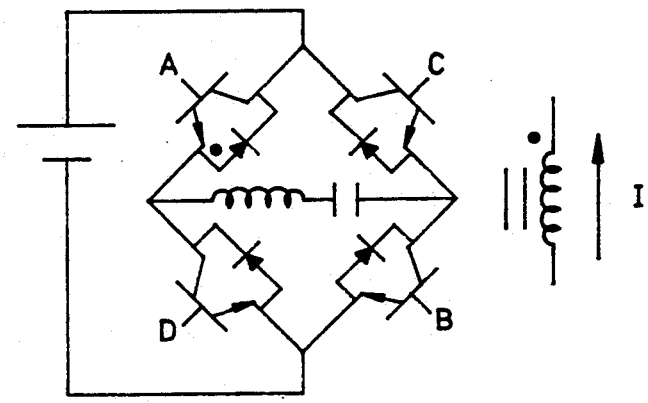
FIG. 11 illustrates a switching amplifier design such as may be used in the invention.

The representative waveforms shown in FIG. 9 have been reproduced on an SPICE computer simulation. This computer simulation predicted theoretical efficiencies of:

linear amp=71% (assuming class B amplifier)
total system=85%,

One aspect of the invention is that all bridges are operated in parallel so that stress is shared and that no bridge is stressed more than any other. Another aspect of the invention is the operation of the switching amplifier. Those skilled in the art should employ a particular switching algorithm to prevent the switching amplifier from bucking the current flowing from the linear amplifier during the switching amplifier's dead time. Referring to FIGS. 11 and 9, for example during the 30° dead time before the switching amplifier turns on, switch A is on to prevent the bridge from bucking current.

It should be understood that the same basic approach of the invention could be used (with a somewhat different square wave and difference waveform) should a high efficiency switching difference amplifier become physically realizable with large power capability. Such an amplifier could accommodate current flowing in either direction through it. In this case if the amplitude of the square wave is 0,785, then it can be shown that ideally the difference amplifier could deliver and absorb equal amounts of power.

The invention provides a high power, low distortion, high efficiency amplifier capable for use over a wide range of output frequencies. The amplifier of the invention will provide less harmonic distortion of an output waveform than is possible with a class D switching approach even in a sinewave synthesis mode. The utilized difference amplifier, being a high bandwidth amplifier (approximately 1 MHz, for example) is able to generate an appropriate waveform to sum with the high efficiency waveform to form a very low distortion output waveform. This invention will permit higher efficiencies than possible with a purely dissipated tube type amplifier while simultaneously achieving low harmonic distortion. Further, less stress on the switches and greater reliability than a class D amplifier operating in sinewave synthesis mode is possible. The bridge power switches in the hybrid high power amplifier of the invention are effectively all in parallel so that no one bridge is stressed more than any other. This is a feature superior to a sinewave synthesis mode Class D amplifier. Once a high bandwidth, high power switching amplifier is developed, this could be substituted for the difference amplifier of the invention, making it possible to construct an extremely high efficiency, high power amplifier. Such a system has been shown to allow the Class D amplifier to switch at zero current. Also the Class D square wave can be chosen at the proper height to allow the difference amplifier to deliver zero average power (equal amounts of power absorbed and delivered). The invention disclosed herein allows an amplifier with these properties.

Obviously, many modifications and variations of the invention are possible in light of the above teachings. It is therefore to be understood that within the scope of the appended claims the invention may be practiced otherwise than as has been specifically described.

What is claimed is:

1. An amplifier apparatus comprising:
   a first amplifier for producing a high efficiency waveform of a first shape;
   a reference waveform generator for producing a reference waveform of a second shape different than said first shape;
   a clock for synchronizing said high efficiency waveform and said reference waveform;
   a comparator for comparing said high efficiency waveform to said reference waveform to produce a difference waveform that is formed from a mathematical difference between said high efficiency waveform and said reference waveform;
   a second amplifier for amplifying said difference waveform to produce an amplified difference waveform; and
   a summer for summing said amplified difference waveform and said high efficiency waveform to produce an amplified waveform of a shape substantially similar to said reference waveform.

2. An apparatus according to claim 1 further including an attenuator scaler for attenuating/scaling said high efficiency waveform before said high efficiency waveform is compared in said comparator.

3. An apparatus according to claim 1 in which said first amplifier includes a switching amplifier.

4. An apparatus according to claim 3 in which said high efficiency waveform of said first shape has a squarewave shape.

5. An apparatus according to claim 4 in which said switching amplifier is a Class D switching amplifier.

6. An apparatus according to claim 5 in which said switching amplifier is of a bridge design.

7. An apparatus according to claim 6 in which said first amplifier includes a plurality of switching amplifiers.

8. An apparatus according to claim 1 in which said second amplifier is a linear amplifier.

9. An apparatus according to claim 8 in which said linear amplifier is a Class A amplifier.

10. An apparatus according to claim 8 in which said linear amplifier is a Class B amplifier.

11. An apparatus according to claim 1 in which said reference waveform of said second shape has a sinusoid shape.

12. An apparatus according to claim 1 in which said summer is a magnetic summer.

13. A hybrid amplifier apparatus comprising:
    a switching amplifier for producing a high efficiency waveform of a first shape;
    a reference waveform generator for producing a reference waveform of a second shape different than said first shape;
    a clock for synchronizing said high efficiency waveform and said reference waveform;
    a comparator for comparing said high efficiency waveform to said reference waveform to produce a difference waveform that is formed from a mathematical difference between said high efficiency waveform and said reference waveform;
    a linear amplifier for amplifying said difference waveform to produce an amplified difference waveform; and
    a summer for summing said amplified difference waveform and said high efficiency waveform to produce an amplified waveform of a shape substantially similar to said reference waveform.

14. An apparatus according to claim 13 further including an attenuator/scaler for attenuating/scaling said high efficiency waveform before said high efficiency waveform is compared in said comparator.

15. An apparatus according to claim 13 in which said high efficiency waveform of said first shape has a squarewave shape.

16. An apparatus according to claim 15 in which said switching amplifier includes a Class D switching amplifier.

17. An apparatus according to claim 15 in which said reference waveform of said second shape has a sinusoid shape.

18. An apparatus according to claim 16 in which said switching amplifier is of a bridge design.

19. An apparatus according to claim 16 in which said switching amplifier includes a plurality of Class D switching amplifiers.

20. An apparatus according to claim 16 in which said linear amplifier is a Class A amplifier.

21. An apparatus according to claim 16 in which said linear amplifier is a Class B amplifier.

22. An apparatus according to claim 20 in which said summer is a magnetic summer.

23. An apparatus according to claim 21 in which said summer is a magnetic summer.

24. A hybrid amplifier apparatus comprising:
    a Class D switching amplifier for producing a high efficiency waveform of a squarewave shape;
    an attenuator/scaler for attenuating/scaling said high efficiency waveform to produce an attenuated/scaled high efficiency waveform;
    a reference waveform generator for producing a reference waveform of a sinusoid shape;
    a clock for synchronizing said high efficiency waveform and said reference waveform;
    a comparator for comparing said attenuated/scaled high efficiency waveform to said reference waveform to produce a difference waveform that is formed from a mathematical difference between said attenuated/sealed high efficiency waveform and said reference waveform;

a linear amplifier for amplifying said difference waveform to produce an amplified difference waveform; and a summer for summing said amplified difference waveform and said high efficiency waveform to produce an amplified waveform that is of a shape substantially similar to said reference waveform of said sinusoid shape.

* * * * *